United States Patent [19]

Kess

[11] Patent Number: 5,144,244

[45] Date of Patent: Sep. 1, 1992

[54] ERROR-PROOF DECOUPLING OF TRANSMISSION AND RECEPTION ANTENNAS IN A NUCLEAR MAGNETIC RESONANCE APPARATUS

[75] Inventor: Helmut Kess, Erlangen, Fed. Rep. of Germany

[73] Assignee: Siemens Aktiengesellschaft, Munich, Fed. Rep. of Germany

[21] Appl. No.: 584,174

[22] Filed: Sep. 18, 1990

[30] Foreign Application Priority Data

Sep. 18, 1989 [EP] European Pat. Off. ............ 89117240

[51] Int. Cl.⁵ .............................................. G01R 33/20
[52] U.S. Cl. ...................................... 324/322; 324/318
[58] Field of Search ............... 324/309, 311, 313, 318, 324/322, 314; 128/653 A, 653 SC

[56] References Cited

U.S. PATENT DOCUMENTS

| | | | |
|---|---|---|---|
| 4,408,162 | 10/1983 | Egger | 324/311 |
| 4,717,881 | 1/1988 | Flugan | 324/322 |
| 4,763,076 | 8/1988 | Arakawa et al. | 324/322 |
| 4,764,726 | 8/1988 | Misic et al. | 324/322 |
| 4,777,440 | 10/1988 | Van Heelsbergen | 324/309 |
| 4,801,885 | 1/1989 | Meissner et al. | 324/318 |
| 4,810,968 | 6/1987 | Van Heelsbergen | 324/322 |
| 4,855,680 | 8/1989 | Arakawa et al. | 324/322 |
| 4,883,984 | 11/1989 | Kess . | |
| 4,926,126 | 5/1990 | Haragashira | 324/322 |
| 4,985,680 | 1/1991 | Maeda et al. | 324/322 |

FOREIGN PATENT DOCUMENTS 0175129 8/1985 European Pat. Off. .
0315382 10/1988 European Pat. Off. .

OTHER PUBLICATIONS

"Elimination of Coupling Between Cylindrical Transmit Coils and Surface Receive Coils for In Vivo NMR", Bendall et al., Mag. Res. in Med., vol. 3, No. 1, (1986), pp. 157-163.

*Primary Examiner*—Michael J. Tokar
*Assistant Examiner*—Raymond Y. Mah
*Attorney, Agent, or Firm*—Hill, Van Santen, Steadman & Simpson

[57] ABSTRACT

A transmission antenna for a nuclear magnetic resonance apparatus has a capacitor connected in parallel with it via at least one PIN diode, and a reception antenna for the apparatus has a capacitor connected directly in parallel with it and an inductor connected in parallel with it via a PIN diode. The PIN diodes are connected to a control voltage in a series circuit. Given a first direction of the control voltage, the PIN diodes are conductive, so that the transmission antenna is tuned to the nuclear magnetic resonant frequency due to cut-in of the capacitor and the reception antenna is detuned to the cut-in of the inductor. Given a second direction of the control voltage, the reception antenna is tuned to the nuclear magnetic resonant frequency and the transmission antenna is detuned with respect to the nuclear magnetic resonant frequency. An unwanted, local super-elevation of the RF power cannot occur with this antenna.

4 Claims, 1 Drawing Sheet

ERROR-PROOF DECOUPLING OF TRANSMISSION AND RECEPTION ANTENNAS IN A NUCLEAR MAGNETIC RESONANCE APPARATUS

BACKGROUND OF THE INVENTION

1. Field of the Invention

The present invention is directed to transmission and reception antennas for use in a nuclear magnetic resonance apparatus for calculating spectra or generating images of an examination subject.

2. Description of the Prior Art

Nuclear magnetic resonance devices for calculating spectra or images of an examination subject include respective coils for generating fundamental and gradient magnetic fields in which the examination subject is disposed, during which the examination subject is irradiated using a transmission antenna with a sequence of RF pulses. The resulting nuclear magnetic resonance signals which are emitted by the examination subject are acquired by a reception antenna.

As described in U.S. Pat. No. 4,801,885, the transmission antenna and the reception antenna may each have a respective matching and tuning unit allocated thereto which contains a PIN diode functioning as switch that influences the resonance tuning, or line matching, of the allocated antenna. The PIN diodes are driven so that the transmission and reception antennas are decoupled from each other in both the transmission mode and the reception mode.

Surface coils are often used as reception antennas for the examination of individual body regions in nuclear magnetic resonance devices because such surface coils improve the spatial resolution in the sensitivity range of the surface coil, due to an increase in the signal-to-noise ratio. A body resonator which covers the entire examination room is preferably used as a transmission antenna so as to generate an optimally uniform signal for RF excitation in the region of the surface coil. The signals generated by the nuclei of the atoms are then received by the surface coil, but their uniformity at this stage plays only a subordinate role. Because the body resonator (transmission antenna) and the surface coil (reception antenna) are tuned to the same resonant frequency, these antennas must be decoupled to prevent one antenna from influencing the other. Under certain circumstances, a major portion of the transmission power may cross over to the surface coil, in which case the RF power density which is permissible at the patient may possibly be exceeded. The image quality would thereby significantly deteriorate. The two antennas must also be decoupled in the reception mode, at which time the reception antenna (surface coil) is resonant and the transmission antenna (body resonator) is detuned. The body resonator is thereby prevented from influencing the reception signal.

For decoupling, the field of the surface coil can be aligned perpendicularly to the field of the body resonator, insofar as the body resonator form a linearly polarized field. The position of the surface coil, however, is fixed relative to the body resonator and cannot be arbitrarily oriented, for example for adaption to anatomical conditions. Given a circularly polarized body resonator, a decoupling of the surface coil and the body resonator is not possible at all in this fashion. For solving this problem, the aforementioned U.S. Pat. No. 4,801,885 discloses the use of a λ/4 cable connected to the body resonator, with the end of the λ/4 cable being short-circuited when emitting RF pulses with the body resonator, and being open when receiving nuclear magnetic resonance signals with the surface coil. Moreover, the resonant circuit of the surface coil is opened via switch during the transmission mode, i.e. given excitation of the examination subject with the body resonator. PIN diodes which can be switched into a conductive state or a blocking state by means of control voltages are used for short circuiting the λ/4 cable, as well as for opening the resonant circuit of the surface coil.

High safety demands in the event of error are made in the decoupling of the body resonator and the surface coil, in view of impermissible RF loads on the patient. The reliability of decoupling using PIN diodes has not been adequate in many instances, so that safety fuses are frequently employed in the resonant circuit of the surface coil, the safety fuses responding when, due to an error in the decoupling circuit, impermissible RF powers arise in the surface coil. These safety fuses, however, necessarily represent an ohmic resistance in the resonant circuit of the surface coil, which deteriorates the image quality.

SUMMARY OF THE INVENTION

It is an object of the present invention to provide transmission and reception antennas for use in a nuclear magnetic resonance apparatus which prevent the occurrence, without the use of safety fuses, of impermissible RF loads in the event of component or drive errors.

The above object is achieved in accordance with the principles of the present invention by allocating PIN diodes to the transmission and reception antennas, the diodes being connected to a control voltage in series in terms of d.c. voltage. The reception antenna is detuned relative to the nuclear magnetic resonance frequency given a first direction of the control voltage, and the transmission antenna is tuned to the nuclear magnetic resonance frequency under this condition. The reception antenna is tuned to the nuclear magnetic resonance frequency and the transmission antenna is detuned with respect to this frequency given a second direction of the control voltage.

Although component or drive errors may result in the non-functioning of the apparatus of the invention, they cannot lead to an impermissible RF load.

In an especially simple embodiment, the matching and tuning unit of the transmission antenna contains a capacitor connected in parallel to the transmission antenna via a first PIN diode, the capacitor effecting tuning of the transmission antenna to the nuclear magnetic resonant frequency when the first PIN diode is in a conductive state. The matching and tuning circuit of the reception antenna contains a capacitor connected in parallel therewith, and also contains a series circuit consisting of a second PIN diode and an inductance, the series circuit being in parallel with the capacitor. The reception antenna is thus detuned with respect to the nuclear magnetic resonance frequency when the second PIN diode is conductive.

A circuit consisting of a first control voltage post, a first blocking inductor, the first PIN diode, a second blocking inductor, a connecting line between the two antennas, a third blocking inductor, the second PIN diode, a fourth blocking inductor and a second control voltage post is preferably provided for driving the PIN diodes, with the PIN diodes being arranged in the same conducting direction in this current path. This circuit enables a simple decoupling of the PIN diodes from each other in terms of RF, and with respect to the control lines.

The matching and tuning circuit of the transmission antenna may contain a plurality of series-connected diodes. The reliability of the circuit is thereby further enhanced.

DESCRIPTION OF THE PREFERRED EMBODIMENTS

Figure 1:
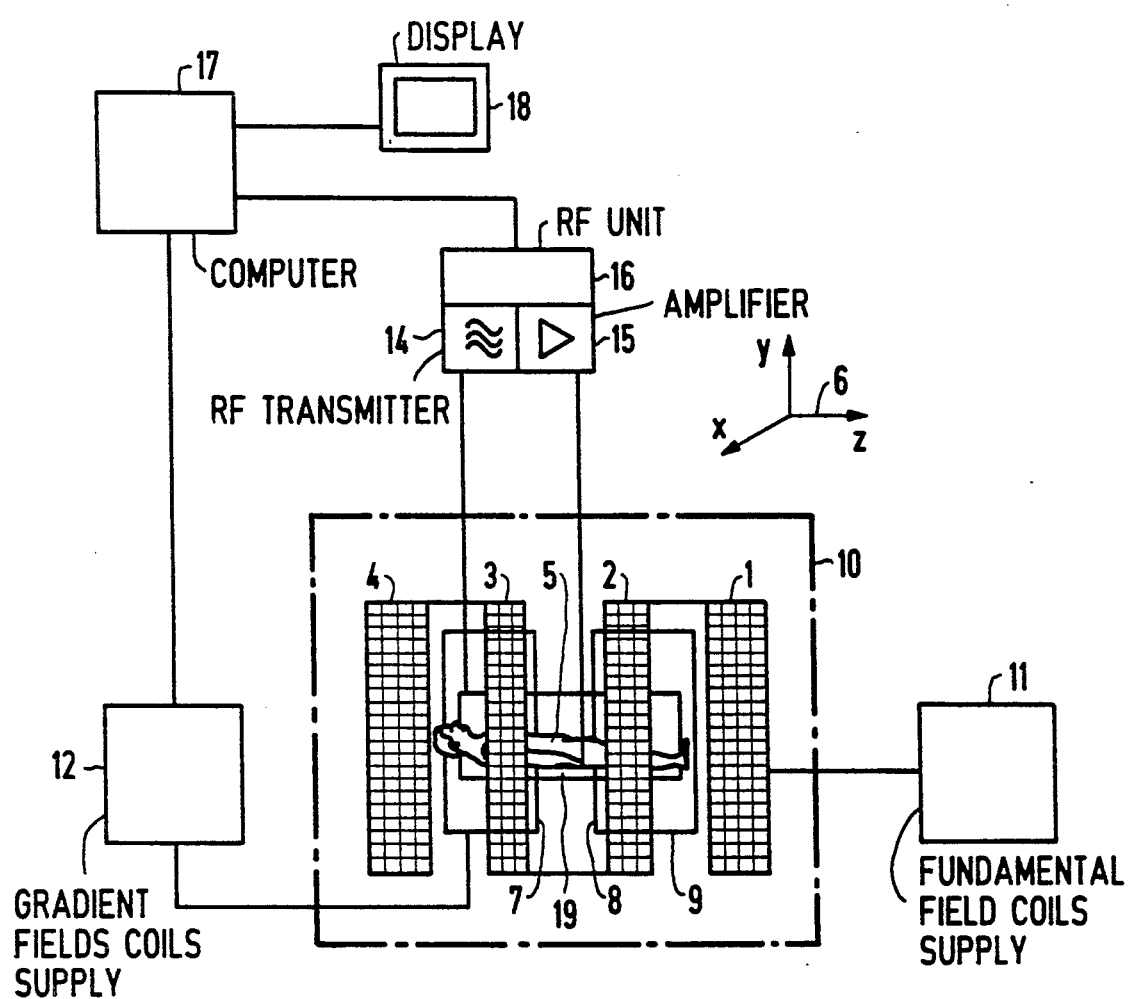
FIG. 1 is a schematic block diagram of a conventional nuclear magnetic resonance apparatus of the type in which the transmission and reception antenna system disclosed herein can be employed.

A conventional nuclear magnetic resonance tomography apparatus is shown in FIG. 1. The apparatus includes coils 1, 2, 3 and 4 which generate a fundamental magnetic field in which, for the purpose of medical diagnostics, the body 5 of a patient to be examined is situated. Gradient coils are also provided for generating independent, orthogonal magnetic field gradients in the x-y-z- directions of the coordinate axis 6. For clarity, only the gradient coils 7 and 8 are shown in the drawing, which serve the purpose of generating the x-gradient, in combination with a pair of identical gradient coils (not shown) disposed on the other side of the patient. A set of y-gradient coils (not shown) is disposed parallel to the body 5 above and below it, and a set of z-gradient coils (not shown) is disposed transversely to the longitudinal axis of the body 5, at the feet and head thereof. The apparatus also includes a body resonator 9 for exciting nuclear magnetic resonance signals, and a surface coil 19 which acquires the resulting nuclear magnetic resonance signals.

The coils 1, 2, 3, 4, 7, 8, AND 9 bounded by the dot-dash line 10 constitute the actual examination instrument. This instrument is operated by an electrical arrangement which includes a fundamental field coils power supply 11 for the fundamental field coils 1 through 4, and a gradient fields coils power supply 12 for the sets of gradient field coils. An RF unit 16 includes an RF transmitter 14 connected to the body resonator 9, and a signal amplifier 15 connected to the surface coil 19. The RF unit 16, and the gradient fields coils power supply 12, are connected to a computer 17, which controls the operation thereof and which generates an image of the examination subject based on the received nuclear magnetic resonance signals. This image is visually reproduced on a display 18.

Figure 2:
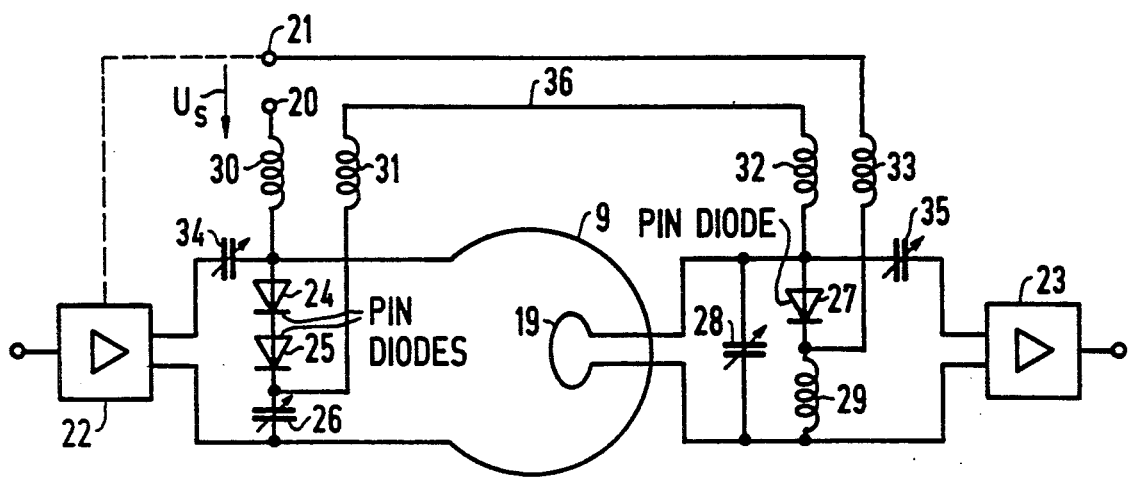
FIG. 2 is a circuit diagram of a transmission and reception antenna system constructed in accordance with the principles of the present invention.

A decoupling circuit constructed in accordance with the principles of the present invention is shown in an exemplary embodiment in FIG. 2. The transmission antenna 9 and the reception antenna 19 are only schematically shown in FIG. 2, and it will be understood by those skilled in the art that those antennas will consist of a number of components which are not separately shown in the drawing. For example, the transmission antenna 9 may be in the form of a plurality of rods surrounding the examination region.

Feed of transmission power into the transmission coil 9 ensues via an amplifier 22 and via a matching circuit consisting of an input capacitor 34 in a series branch and a capacitor 26 in a shunt branch. The transmission coil 9 can thus be matched to the characteristic impedance of the output of the amplifier 22, and of the connecting line to the amplifier 22, and can be tuned to the nuclear magnetic resonant frequency. The capacitor 26 is connected in series with two PIN diodes 24 and 25, the diodes 24 and 25 being connected in parallel with the transmission antenna 9.

The capacitor 28 is connected directly in parallel with the reception antenna 19. The capacitor 28 is dimensioned so that the reception antenna 19 is tuned to the nuclear magnetic resonant frequency insofar as no additional elements are connected. The reception antenna 19 is connected to an RF amplifier 23 via an output capacitor 35. A series circuit of a PIN diode 27 and an inductor 29 is connected in parallel with the capacitor 28.

The PIN diodes 24, 25 and 27 are controlled by a control voltage $U_s$ applied across control voltage posts 20 and 21. The posts 20 and 21 are in a circuit containing, in sequence, a blocking inductor 30, the PIN diodes 24 and 25, a blocking inductor 31, a connecting line 36 to the matching and tuning circuit of the reception antenna 19, a blocking inductor 32, the PIN diode 27 and a blocking inductor 33. The blocking inductors 30 through 33 prevent RF coupling between the transmission circuit and the reception circuit as well as to the control $U_s$.

In the transmission mode, a control voltage $U_s$ is applied in a direction which renders all of the PIN diodes 24, 25 and 27 conducting. The capacitor 26 is thus connected in parallel with the transmission antenna 9 in terms of RF so that the transmission antenna 9 is tuned to the nuclear magnetic resonance frequency, and is to the characteristic impedance of the RF amplifier 22 and to the lead between the amplifier and the transmission antenna 9. The RF power is thus transmitted via the transmission antenna 9 and generates the RF excitation field.

At the reception side, the inductance 29 is connected in parallel with the capacitor 28 by the conductive PIN diode 27, so that the reception antenna 19 is detuned with respect to the nuclear magnetic resonance frequency. No RF power is thus coupled into the reception antenna 19 so that neither a falsification of the transmission field nor a local super-elevation of the RF power occurs.

In the reception mode, a control voltage $U_s$ is applied in a direction which rendered the PIN diodes 24, 25 and 27 non-conducting. Under this condition, no RF current can flow across these PIN diodes. At the transmission side, therefore, the capacitor 26 is disconnected from the transmission circuit, so that a mismatching and detuning of the transmission antenna occurs. Any RF power which arrives in the event of error is therefore reflected and cannot be transmitted via the transmission antenna 9, or even proceed to the reception antenna 19.

At the reception side, the inductance 29 is disconnected in terms of RF, so that the reception antenna 19 is resonant with respect to the nuclear magnetic frequency.

The following errors are possible in the circuit shown in FIG. 2, and the consequences of these errors are as follows:

1. Interruption or Outage of the Control Voltage $U_s$

The transmission antenna 9 is mismatched and detuned, because the capacitor 26 is not connected to their transmission antenna 9 in terms of RF.

RF power is therefore not coupled to the examination subject or coupled into the reception coil.

2. The PIN Diodes of the Transmission Side are Shorted

The PIN diode 27 receives a control current, so that the reception antenna 19 is detuned. No RF power can thus proceed to the reception antenna 19 so that no local super-elevation of the RF power is possible.

3. The PIN Diode 27 is Shorted

The reception antenna 19 is thus permanently detuned. Although a poor image quality will result, a local super-elevation of the RF power is not possible of the detuning.

4. One of the PIN Diodes 24 or 25 is Shorted and the Control Voltage $U_s$ is Interrupted Due to the series-connected second PIN diode 24 or 25 at the transmission side, the capacitor 26 is disconnected and the transmission antenna 19 is mismatched and detuned. The RF power is therefore reflected. No patient examination is possible, and impermissible RF power concentration cannot occur.

In addition to being suppressed by the series connection of two or more PIN diodes at the transmission side, error conditions (4) can also be suppressed by enabling drive of the transmission output stage, or enabling the output thereof, only given the existence of a control voltage $U_s$. For that purpose, enabling of the RF output voltage may ensue via a PIN diode which is connected in series with the PIN diodes 24, 25 and 27 in terms of d.c. voltage. If the control voltage $U_s$ is interrupted, the RF amplifier 22 can no longer generate any output power.

The circuit shown in FIG. 2 may be employed for a plurality of transmission and reception antennas. Each transmission and reception antenna will be provided with a circuit corresponding to FIG. 2, and all PIN diodes will be connected in series in terms of d.c. voltage.

Although modifications and changes may be suggested by those skilled in the art, it is the intention of the inventor to embody within the patent warranted hereon all changes and modifications as reasonably and properly come within the scope of his contribution to the art.

I claim as my invention:

1. In a nuclear magnetic resonance apparatus, a matching and tuning unit for a transmission antenna and a reception antenna comprising:

means for tuning and matching a transmission antenna including a first PIN diode connected to said transmission antenna for switching the connection of tuning and matching components to said transmission antenna;

means for tuning and matching a reception antenna including a second PIN diode connected to said reception antenna for switching the connection of tuning and matching components to said reception antenna;

said first and second PIN diodes being connected in series in terms of d.c. voltage with a control voltage so that said reception antenna is detuned relative to the nuclear magnetic resonant frequency and the transmission antenna is tuned to the nuclear magnetic resonant frequency given a first direction of the control voltage and so that the reception antenna is tuned to the nuclear magnetic resonant frequency and the transmission antenna is detuned with respect to the nuclear magnetic resonant frequency given a second direction of the control voltage.

2. A matching and tuning unit as claimed in claim 1 wherein said means for tuning and matching said transmission antenna includes a capacitor forming a series connection with said first PIN diode, said series connection being connected in parallel with said transmission antenna for tuning said transmission antenna to the nuclear magnetic resonant frequency when said first PIN diode is conductive, and wherein said matching and tuning circuit for said reception antenna includes a capacitor connected in parallel with said reception antenna and a series connection formed by said second PIN diode and an inductance, said series connection being connected in parallel with the capacitor across said reception antenna for detuning said reception antenna with respect to the nuclear magnetic resonant frequency when said second PIN diode is conductive.

3. A matching and tuning unit as claimed in claim 2 comprising a path for control current corresponding to said control voltage comprising, in sequence, a first control voltage post, a first blocking inductor, said first PIN diode, a second blocking inductor, a connecting line between said transmission antenna and said reception antenna, a third blocking inductor, said second PIN diode, a fourth blocking inductor, and a second control voltage post, said first and second PIN diodes being connected in said current path in the same conducting direction, and said control voltage being applied across said first and second control voltage posts.

4. A matching and tuning unit as claimed in claim 2 wherein said means for tuning and matching said transmission antenna includes at least one further PIN diode connected in series with said first PIN diode in the same conducting direction as said first PIN diode.

* * * * *